United States Patent
Yamamoto et al.

(10) Patent No.: US 11,843,080 B2
(45) Date of Patent: Dec. 12, 2023

(54) NITRIDE SEMICONDUCTOR LIGHT-EMITTING ELEMENT

(71) Applicant: NIKKISO CO., LTD., Tokyo (JP)

(72) Inventors: Shuichiro Yamamoto, Ishikawa (JP); Tadaaki Maeda, Ishikawa (JP); Naoki Shibata, Ishikawa (JP)

(73) Assignee: Nikkiso Co., Ltd., Tokyo (JP)

( * ) Notice: Subject to any disclaimer, the term of this patent is extended or adjusted under 35 U.S.C. 154(b) by 0 days.

(21) Appl. No.: 16/957,915

(22) PCT Filed: Oct. 12, 2018

(86) PCT No.: PCT/JP2018/038045
§ 371 (c)(1),
(2) Date: Jun. 25, 2020

(87) PCT Pub. No.: WO2019/130725
PCT Pub. Date: Jul. 4, 2019

(65) Prior Publication Data
US 2020/0365779 A1    Nov. 19, 2020

Related U.S. Application Data (63) Continuation of application No. PCT/JP2018/038045, filed on Oct. 12, 2018.

(30) Foreign Application Priority Data

Dec. 26, 2017 (JP) ................................ 2017-249040

(51) Int. Cl.
*H01L 33/32* (2010.01)
*H01L 33/44* (2010.01)
(Continued)

(52) U.S. Cl.
CPC .............. *H01L 33/56* (2013.01); *H01L 33/32* (2013.01); *H01L 33/44* (2013.01); *H01L 33/486* (2013.01)

(58) Field of Classification Search
CPC ......... H01L 33/59; H01L 35/52; H01L 33/44; H01L 33/486; H01L 33/32
See application file for complete search history.

(56) References Cited

U.S. PATENT DOCUMENTS 8,420,414 B2 * 4/2013 Horiuchi .................. H01L 24/97
438/33
10,418,525 B2 * 9/2019 Yamamoto .............. H01L 33/42
(Continued)

FOREIGN PATENT DOCUMENTS

JP    2007-116139 A    5/2007
JP    2007-227433 A    9/2007
(Continued)

OTHER PUBLICATIONS

International Search Report dated Jan. 15, 2019 issued in PCT/JP2018/038045.
(Continued)

*Primary Examiner* — Savitri Mulpuri
(74) *Attorney, Agent, or Firm* — Scully, Scott, Murphy & Presser, PC (57) ABSTRACT

A semiconductor light-emitting device includes a semiconductor light-emitting element that emits ultraviolet light, a package substrate mounting the semiconductor light-emitting element, a sealing resin that seals the semiconductor light-emitting element, and a coat film further provided between a light output surface of the semiconductor light-emitting element and the sealing resin. The refractive index of the coat film and the refractive index of the sealing resin are smaller than the refractive index of a member constituting the light output surface of the semiconductor light-
(Continued)

emitting element, and the refractive index difference between the coat film and the sealing resin is not more than 0.15.

2 Claims, 6 Drawing Sheets

(51) Int. Cl.
*H01L 33/56* (2010.01)
*H01L 33/48* (2010.01)

(56) References Cited

U.S. PATENT DOCUMENTS

| | | |
|---|---|---|
| 2009/0045422 A1 | 2/2009 | Kato et al. |
| 2014/0239328 A1 | 8/2014 | Lee et al. |
| 2015/0221837 A1* | 8/2015 | Yonezaki ............... H01L 33/56 524/391 |
| 2015/0255694 A1 | 9/2015 | Lee et al. |
| 2015/0291834 A1 | 10/2015 | Isotani et al. |
| 2016/0233389 A1* | 8/2016 | Furuyama ........... H01L 33/0093 |

FOREIGN PATENT DOCUMENTS

| | | | | |
|---|---|---|---|---|
| JP | 2007-258701 A | | 10/2007 | |
| JP | 2008-041968 A | | 2/2008 | |
| JP | 2009-111245 A | | 5/2009 | |
| JP | 2012-114231 A | | 6/2012 | |
| JP | 2012-156383 | * | 8/2012 | ..... H01L 1224/8592 |
| JP | 2012156383 A | | 8/2012 | |
| JP | 2013-099193 A | | 5/2013 | |
| JP | WO 2014/057858 A | | 4/2014 | |

OTHER PUBLICATIONS

JP Office Action dated Feb. 12, 2020 issued in JP 2017-249040.
Notice of Reasons for Refusal dated Sep. 15, 2020 from related Japanese Patent Application No. 2017-249040 together with English language translation.
Translation of International Preliminary Report on Patentability and Written Opinion dated Jul. 9, 2020 issued in PCT/JP2018/038045.
Notice of Reasons for Refusal dated Feb. 1, 2022 from related Japanese Patent Application No. 2017-249040 together with English language translation.

* cited by examiner

NITRIDE SEMICONDUCTOR LIGHT-EMITTING ELEMENT

TECHNICAL FIELD

The invention relates to a semiconductor light-emitting device that emits ultraviolet radiation.

BACKGROUND ART

Resin-sealed semiconductor light-emitting devices having a light-emitting diode (LED) sealed with a resin such as silicone resin are generally known as conventional semiconductor light-emitting devices emitting blue light or white light. On the other hand, glass-sealed packages sealed with glass such as quartz are mainly used for semiconductor light-emitting devices which emit ultraviolet radiation, particularly, for semiconductor light-emitting devices which emit deep ultraviolet light at a wavelength of not more than 300 nm.

JP 2008/041968 is a prior art document related to the invention of the present application.

CITATION LIST

Patent Literature

JP 2008/041968

SUMMARY OF INVENTION

Technical Problem

The glass-sealed packages mentioned above have problems of high cost and low yield of glass sealing process, and it is thus desired that semiconductor light-emitting devices emitting ultraviolet light be also sealed with resin.

However, there are problems that the sealing resin is likely to degrade due to the emitted light itself and this shortens the lifetime particularly in the semiconductor light-emitting devices which emit deep ultraviolet light. Light output needs to be very low to ensure sufficient lifetime, hence, it is difficult to achieve both practical light output and lifetime.

It is an object of the invention to provide a resin-sealed semiconductor light-emitting device which achieves both practical light output and lifetime.

Solution to Problem

A semiconductor light-emitting device in an aspect of the invention is provided with a semiconductor light-emitting element that emits ultraviolet light; a package substrate mounting the semiconductor light-emitting element; a sealing resin that seals the semiconductor light-emitting element; and a coat film further provided between a light output surface of the semiconductor light-emitting element and the sealing resin, wherein the refractive index of the coat film and the refractive index of the sealing resin are smaller than the refractive index of a member constituting the light output surface of the semiconductor light-emitting element, and the refractive index difference between the coat film and the sealing resin is not more than 0.15.

Advantageous Effects of Invention

According to an aspect of the invention, it is possible to provide a resin-sealed semiconductor light-emitting device which achieves both practical light output and lifetime.

DESCRIPTION OF EMBODIMENT

Embodiment

An embodiment of the invention will be described below in reference to the appended drawings.

Figure 1:
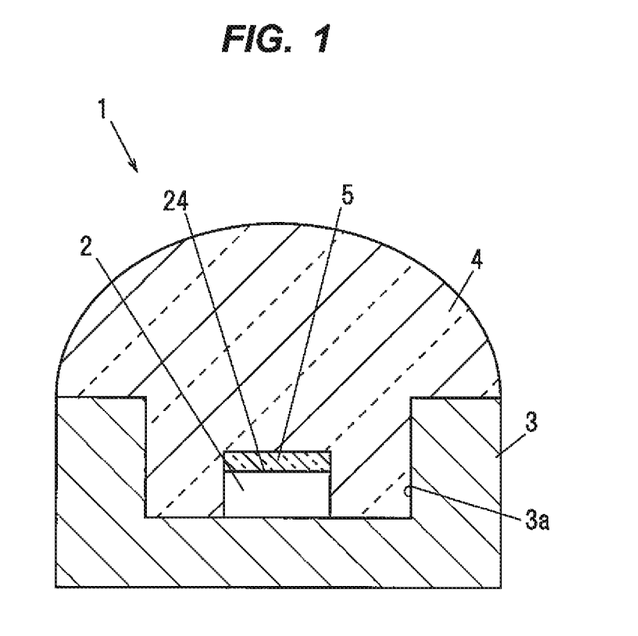
FIG. 1 is a cross sectional view showing a light-emitting device using a semiconductor light-emitting device in an embodiment of the present invention.
Figure 2:
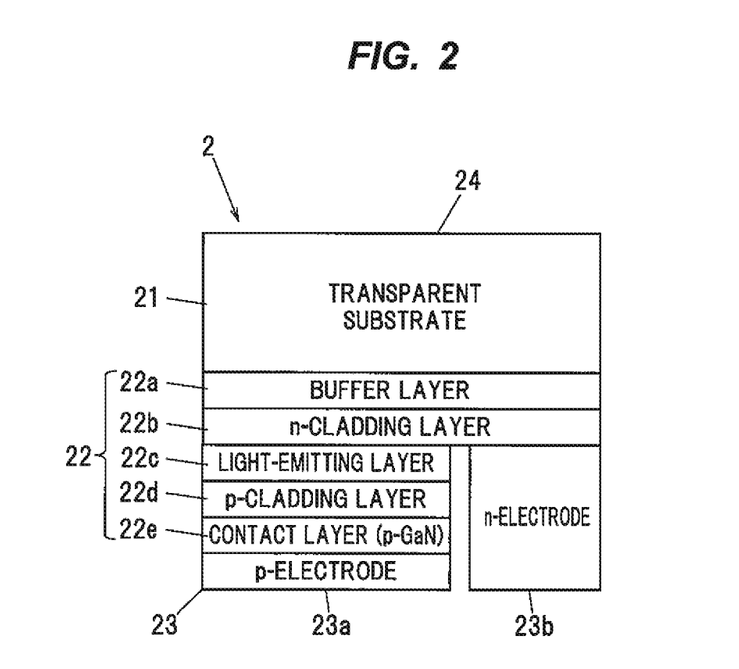
FIG. 2 is an explanatory diagram illustrating a stacked structure of a semiconductor light-emitting element.

FIG. 1 is a cross sectional view showing a light-emitting device using a semiconductor light-emitting device in the present embodiment. FIG. 2 is an explanatory diagram illustrating a stacked structure of a semiconductor light-emitting element.

A semiconductor light-emitting device 1 is provided with a semiconductor light-emitting element 2 emitting ultraviolet light, a package substrate 3 mounting the light-emitting element 2, a sealing resin 4 sealing the semiconductor light-emitting element 2, and a coat film 5. Each member will be described in detail below.

Package Substrate 3

The package substrate 3 is formed in a substantially rectangular parallelepiped shape and has a recessed portion 3a on the upper surface thereof. The package substrate 3 is constructed from, e.g., a high temperature co-fired ceramic (HTCC) multi-layered substrate.

Semiconductor Light-Emitting Element 2

The semiconductor light-emitting element 2 is constructed from an ultraviolet LED which emits ultraviolet light (deep ultraviolet light) at a wavelength of not more than 300 nm. As shown in FIG. 2, the semiconductor light-emitting element 2 has a growth substrate 21, an AlGaN-based nitride semiconductor layer 22 formed on the growth substrate 21, and an electrode 23. In the present embodiment, the nitride semiconductor layer 22 is configured that a buffer layer 22a formed of AlN, an n-cladding layer 22b formed of n-type AlGaN, a light-emitting layer 22c including AlGaN, a p-cladding layer 22d formed of p-type AlGaN, and a contact layer 22e formed of p-type GaN are sequentially stacked in this order from the growth substrate 21 side. The electrode 23 has an anode-side electrode portion (p-electrode) 23a formed on the contact layer 22e, and a cathode-side electrode portion (n-electrode) 23b formed on the n-cladding layer 22b.

The semiconductor light-emitting element 2 is housed in the recessed portion 3a and mounted on a bottom surface of the recessed portion 3a. The semiconductor light-emitting element 2 is flip-chip mounted on the package substrate 3, with the growth substrate 21 located on the upper side (on the opening side of the recessed portion 3a) and the nitride semiconductor layer 22 located on the lower side (on the bottom surface side of the recessed portion 3a, on the package substrate 3 side). Although it is not shown in the drawing, the electrodes 23a, 23b are electrically connected via an electrode provided on the package substrate 3 and gold bumps, etc.

In the present embodiment, ultraviolet light emitted by the light-emitting layer 22c passes through the growth substrate 21 and is guided to the outside of the semiconductor light-emitting element 2. Thus, in the present embodiment, a surface of the growth substrate 21 (a surface opposite to the nitride semiconductor layer 22) acts as a light output surface 24 of the semiconductor light-emitting element 2. In addition, a member constituting the light output surface 24 of the semiconductor light-emitting element 2 is the growth substrate 21 in the present embodiment. Thus, it is desirable to use the growth substrate 21 of which transmittance to the emitted ultraviolet light is as high as possible, in more detail, the transmittance to the emitted ultraviolet light is not less than 70%. A single crystal substrate such as sapphire substrate or AlN substrate can be used as the growth substrate 21. In the present embodiment, a sapphire substrate is used as the growth substrate 21. The growth substrate 21 may be removed by a method such as laser removal or chemical etching when the transmittance to ultraviolet light is low or in order to increase extraction efficiency. In this case, the member constituting the light output surface 24 of the semiconductor light-emitting element 2 is the buffer layer 22a. Alternatively, the buffer layer 22a may be also removed together with the growth substrate 21 so that the member constituting the light output surface 24 of the semiconductor light-emitting element 2 can be the n-cladding layer 22b formed of n-type AlGaN.

Sealing Resin 4

The sealing resin 4 is provided to cover the entire semiconductor light-emitting element 2. The sealing resin 4 is provided to fill the recessed portion 3a of the package substrate 3 and to bulge upward of the package substrate 3, and has the upper surface formed in a smoothly curved shape (e.g., a hemispherical shape or a semi-elliptical spherical shape). Thus, as compared to when the upper surface is, e.g., flat, total reflection at the boundary between the sealing resin 4 and air is reduced, allowing light extraction efficiency to be improved. In addition, the sealing resin 4 acts as a lens, which allows for control of the emission direction of ultraviolet light. In addition, it is desirable to use the sealing resin 4 which has a refractive index between the refractive index of the member constituting the light output surface 24 of the semiconductor light-emitting element 2 (the sapphire substrate in this example) and the refractive index of the air. This improves efficiency of extracting ultraviolet light from the light output surface 24 of the semiconductor light-emitting element 2, thereby contributing to improvement in luminous intensity.

In other words, the sealing resin 4 acts to protect the semiconductor light-emitting element 2 by covering the semiconductor light-emitting element 2, acts to improve light extraction efficiency by reducing the refractive index difference between the member constituting the light output surface 24 of the semiconductor light-emitting element 2 and the air, and also acts as a lens to control the emission direction of ultraviolet light.

It is desirable to use the sealing resin 4 of which transmittance to ultraviolet light emitted from the semiconductor light-emitting element 2 is as high as possible, and the transmittance of ultraviolet light (deep ultraviolet light at not more than 300 nm in this example) through the sealing resin 4 is preferably not less than 80%. It is also desirable to use the sealing resin 4 which does not easily degrade due to ultraviolet light. In detail, a resin containing a silicone resin or a fluorocarbon polymer, etc., as a main component can be used as the sealing resin 4. The sealing resin 4 may contain a filler, etc., where appropriate. In the present embodiment, a silicone resin available at lower cost is used as the sealing resin 4.

Degradation of Sealing Resin 4

The silicone resin used as the sealing resin 4 exhibits relatively little degradation upon exposure to ultraviolet light, but degradation due to ultraviolet light still occurs in organic constituents such as methyl group, particularly functional group, etc. For this reason, the sealing resin 4 severely degrades when exposed to high-intensity ultraviolet light and lifetime of the semiconductor light-emitting device 1 decreases.

Figure 3A:
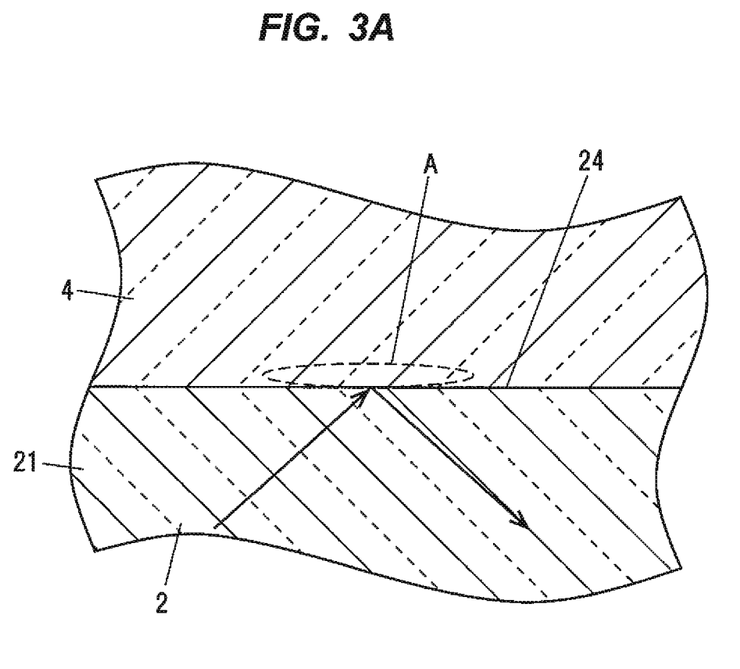
FIG. 3A is an explanatory diagram illustrating an impact of evanescent light on a sealing resin in Conventional Example in which a coat film is not formed.

Now consider a case where the light output surface 24 of the semiconductor light-emitting element 2 is in direct contact with the sealing resin 4 and light is incident toward the sealing resin 4 from the growth substrate 21 (i.e., the member constituting the light output surface 24 of the semiconductor light-emitting element 2; the same applies hereinafter) side, as shown in FIG. 3A. The refractive index of the sapphire substrate as the growth substrate 21 (about 1.8) is higher than the refractive index of the silicone resin as the sealing resin 4 (about 1.4). Therefore, when light is incident at an incident angle of not less than the critical angle, the light is totally reflected at the interface between the growth substrate 21 and the sealing resin 4.

At this time, the light on the growth substrate 21 side does not suddenly become zero on the sealing resin 4 side, and light called evanescent light seeps into the sealing resin 4. The light intensity of the evanescent light is a function of a distance from the interface and is equal to the light intensity of the totally reflected light at the interface (at the distance=0). That is, the sealing resin 4 in the vicinity of the interface between the growth substrate 21 and the sealing resin 4 (a region A in FIG. 3) is affected by not only the light passing through the interface but also the light totally reflected at the interface.

Although degradation of the sealing resin 4 occurs in all regions exposed to ultraviolet light, the density of ultraviolet light becomes very high particularly in the vicinity of the interface with the growth substrate 21 as described above, causing a change in properties, hardening and shrinkage of the sealing resin 4. As a result, high stress is generated between the growth substrate 21 and the sealing resin 4, and once the stress reaches the limit, fractures and cracks occurs in the sealing resin 4 at the interface with the growth substrate 21.

Figure 3B:
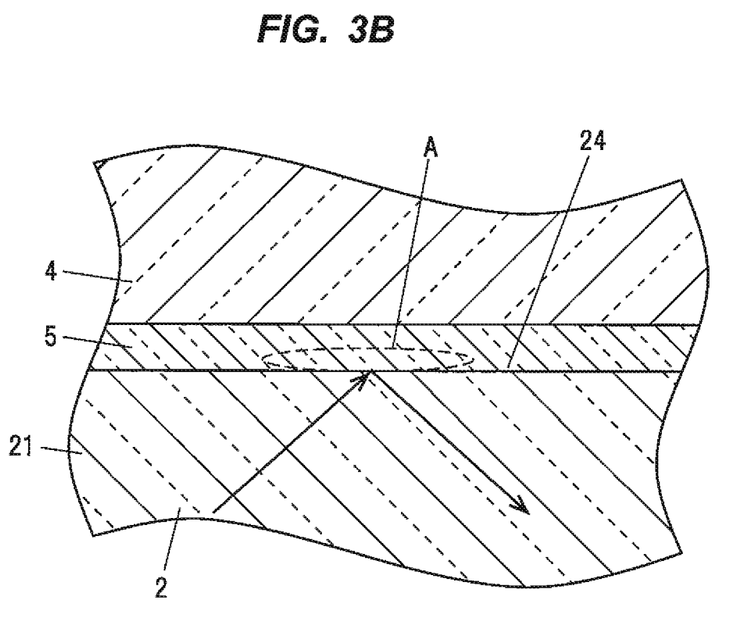
FIG. 3B is an explanatory diagram illustrating an impact of totally reflected light on the sealing resin in the invention in which the coat film is formed.

Based on this, in the present embodiment, the coat film 5 having substantially the same refractive index as the sealing resin 4 is inserted between the growth substrate 21 and the sealing resin 4 as shown in FIG. 3B so that the interface at which total reflection occurs is changed to the interface between the growth substrate 21 and the coat film 5. In this configuration, since the sealing resin 4 has a distance from the interface at which total reflection occurs, an impact of the totally reflected light on the sealing resin 4 is reduced and it is thus possible to suppress degradation of the sealing resin 4.

Description of Coat Film 5

The coat film 5 is provided between the growth substrate 21 and the sealing resin 4. The coat film 5 is to reduce the impact of the totally reflected light (the impact of the evanescent light) on the sealing resin 4.

To improve light extraction efficiency from the growth substrate 21, the refractive index of the coat film 5 and the refractive index of the sealing resin 4 need to be lower than the refractive index of the growth substrate 21. In addition, to reduce total reflection at the interface between the growth substrate 21 and the sealing resin 4, the refractive index of the coat film 5 needs to be equivalent to the refractive index of the sealing resin 4.

In detail, the refractive index difference between the coat film 5 and the sealing resin 4 is preferably not more than 0.15. That is, the semiconductor light-emitting device 1 in the present embodiment is configured that the refractive indices $n_1$ to $n_3$ satisfy all the following expressions (1) to (3):

$$n_1 > n_2 \qquad (1)$$

$$n_1 > n_3 \qquad (2)$$

$$|n_2 - n_3| \leq 0.15 \qquad (3)$$

where $n_1$ is the refractive index of the growth substrate 21, $n_2$ is the refractive index of the coat film 5, and $n_3$ is the refractive index of the sealing resin 4.

When the refractive index difference between the coat film 5 and the sealing resin 4 is more than 0.15 and $n_2 > n_3$, total reflection at the interface between the growth substrate 21 and the coat film 5 decreases and total reflection at the interface between coat film 5 and the sealing resin 4 increases, hence, it is not possible to sufficiently reduce the impact of the totally reflected light on the sealing resin 4 and the effect of suppressing degradation of the sealing resin 4 is smaller. On the other hand, when the refractive index difference is more than 0.15 and $n_2 < n_3$, total reflection at the interface between the growth substrate 21 and the coat film 5 significantly increases and the transmitted light is significantly reduced, hence, light output decreases. That is, when all the above expressions (1) to (3) are satisfied, it is possible to suppress degradation of the sealing resin 4 and improve lifetime while improving light output.

In addition, to reduce light loss caused by providing the coat film 5, the transmittance of the ultraviolet light (deep ultraviolet light at not more than 300 nm in this example) through the coat film 5 is desirably not less than 90%.

Furthermore, the coat film 5 desirably contains as less organic constituents as possible and has sufficient light resistance to ultraviolet light, and it is desirable to use the coat film 5 which is less likely to exhibit a physical change such as change in properties, shrinkage or occurrence of cracks upon exposure to ultraviolet light.

As the coat film 5 which satisfies such conditions, it is possible to use a glass film containing $SiO_2$ as a main component, or amorphous $SiO_2$. The glass film can be formed by vitrification (glassification) of a vitrescible hardening material such as alcohol-soluble organosilicon compound, or application and vitrification of a glass coating material such as silazane. The amorphous $SiO_2$ can be formed by, e.g., vapor deposition, sputtering, CVD (chemical vapor deposition), ALD (Atomic Layer Deposition), or sol-gel process, etc. In the present embodiment, the coat film 5 formed of a glass material containing $SiO_2$ as a main component is formed by applying and vitrifying an alcohol-soluble organosilicon compound on the upper surface of the light output surface 24 of the semiconductor light-emitting element 2.

When the glass film is used as the coat film 5, the coat film 5 is desirably as thin as possible and desirably has a thickness of not more than 25 μm so that occurrence of cracks in the coat film 5 is suppressed. More preferably, the thickness of the coat film 5 is not less than 0.5 μm and not more than 5.0 μm.

In addition, a surface of the coat film 5 (a surface on the sealing resin 4 side) may be formed in a curved shape. For example, when forming the coat film 5, a glass coating material is applied to the light output surface 24 of the semiconductor light-emitting element 2 so as to be relatively thick at the center portion as viewed from above and the applied glass coating material is vitrified. The coat film 5 having a surface with a curved shape (e.g., hemispherical shape) convex toward the sealing resin 4 can be thereby formed. With this configuration, it is possible to reduce total reflection at the interface between the coat film 5 and the sealing resin 4 and thereby improve light extraction efficiency. However, also in this case, the maximum thickness of the coat film 5 is preferably not more than 5.0 μm to suppress occurrence of cracks in the coat film 5.

The coat film 5 desirably has a very high transmittance and good light resistance to ultraviolet light as described above and is thus desirably formed of a glass material, not a resin. Considering this, for example, the semiconductor light-emitting element 2 could be sealed with only a glass material without providing the sealing resin 4, but in this case, a high-temperature process is required to shape the glass material into a lens shape, etc., which causes a problem in ease of manufacture (processability, ability of mass production) or a problem of characteristic degradation of the semiconductor light-emitting element 2. The silicone resin used as the sealing resin 4 in the present embodiment has less light resistance than the glass material but is highly moldable and can be easily molded into a lens shape, etc., which provides high light extraction efficiency. In the semiconductor light-emitting device 1 of the present embodiment, the coat film 5 formed of a glass material provides light resistance and the sealing resin 4 formed of a silicone resin provides moldability, hence, improvement in light extraction efficiency, improvement in lifetime and ease of manufacture are simultaneously realized.

Description of Continuous Current Test Results

After forming the coat film 5 by applying and vitrifying an alcohol-soluble organosilicon compound on the light output surface 24 of the semiconductor light-emitting element 2, the semiconductor light-emitting element 2 was sealed with the sealing resin 4 and the semiconductor light-emitting device 1 of FIG. 1 was thereby obtained as Example of the invention. A semiconductor light-emitting device in Conventional Example was also made with the same configuration as that shown in FIG. 1, except that the coat film 5 was omitted. Continuous current test was conducted on the semiconductor light-emitting devices made as Example and Conventional Example, where light outputs was measured at every certain power-on time (test time) and whether or not cracks occurred in the sealing resin 4 was also observed. The test results are shown together in FIG. 4.

Figure 4:
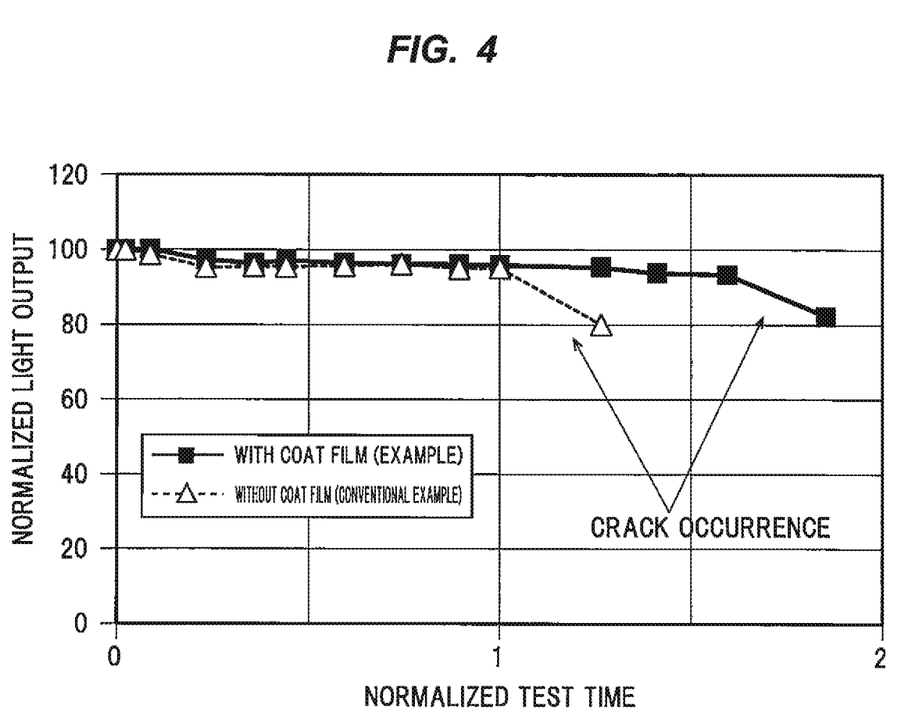
FIG. 4 is a graph showing the results of a power-on test in Example of the invention and Conventional Example.

As a result of observing the sealing resin 4, it was confirmed that cracks occurred in the sealing resin 4 when light output dropped greatly in FIG. 4. Based on the results shown in FIG. 4, it was confirmed that by forming the coat film 5, lifetime (reliability) is improved about 1.5 times as compared to Conventional Example.

Modification

Figure 5:
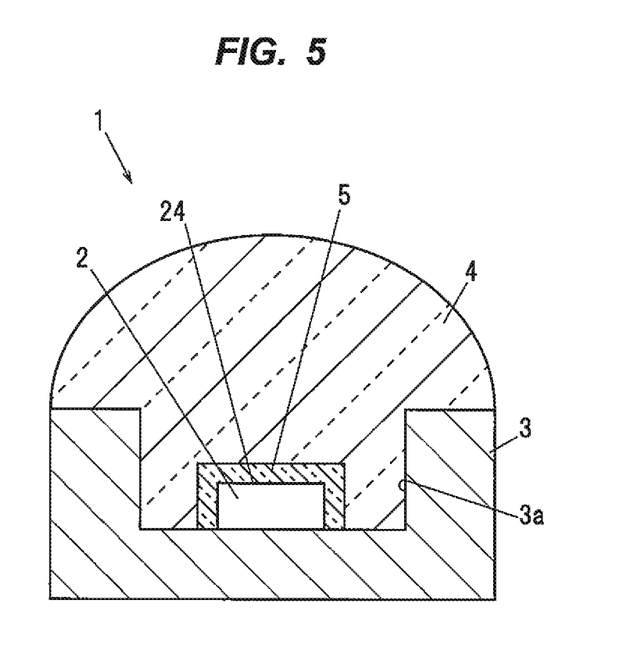
FIG. 5 is a cross sectional view showing the light-emitting device in a modification of the invention.

Although the coat film 5 is formed only on the light output surface 24 of the semiconductor light-emitting element 2 (the upper surface of the semiconductor light-emitting element 2) in the present embodiment, the coat film 5 may be formed to cover the entire semiconductor light-emitting element 2 as shown in FIG. 5. In this case, the coat film 5 may continuously cover the surface of the package substrate 3 (the bottom surface of the recessed portion 3a).

Figure 6:
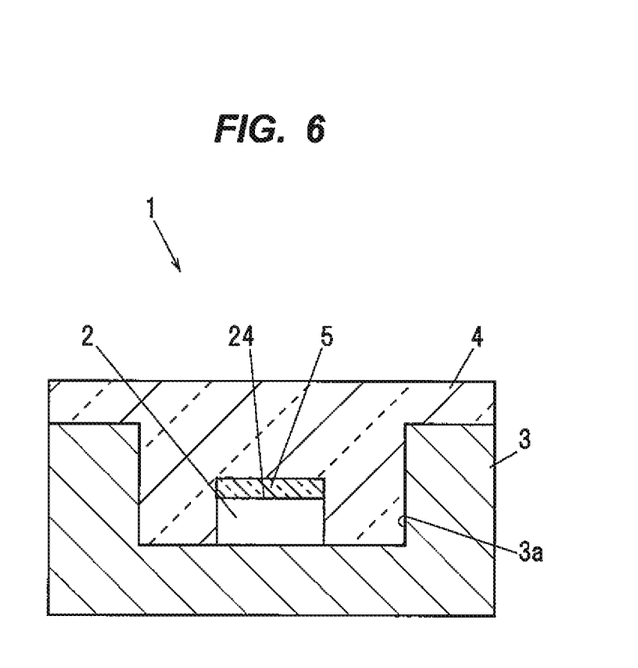
FIG. 6 is a cross sectional view showing the light-emitting device in a modification of the invention.
Figure 7:
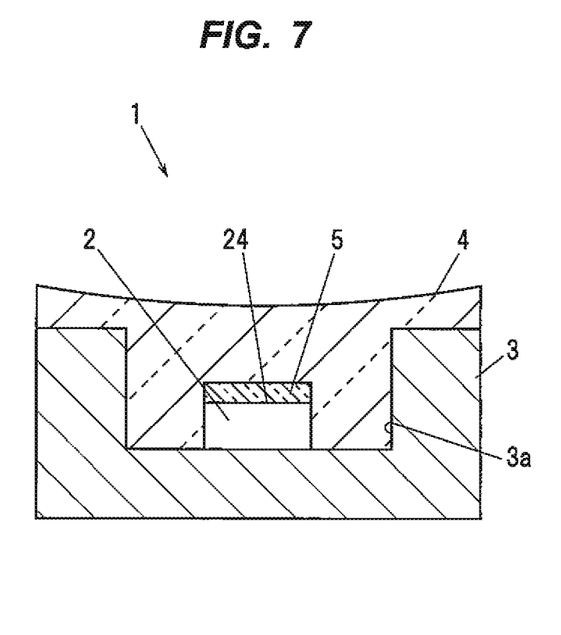
FIG. 7 is a cross sectional view showing the light-emitting device in a modification of the invention.
Figure 8:
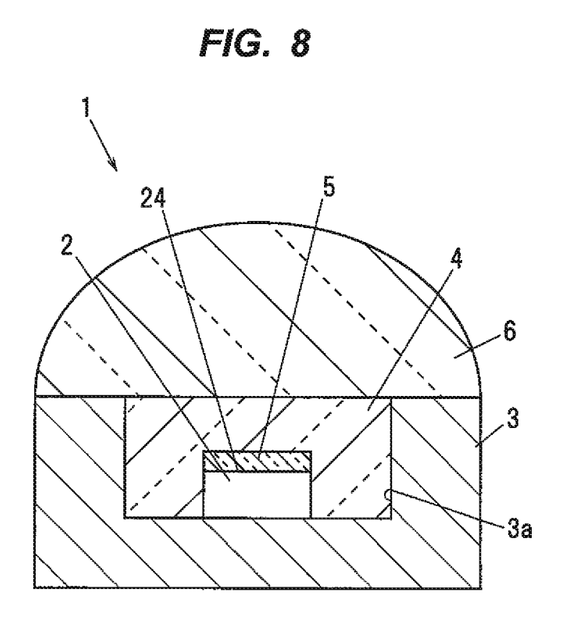
FIG. 8 is a cross sectional view showing the light-emitting device in a modification of the invention.

In addition, although the example in which the upper surface of the sealing resin 4 is formed in a hemispherical shape has been described in the present embodiment, the shape of the sealing resin 4 is not limited thereto. The sealing resin 4 may have, e.g., a flat upper surface as shown in FIG. 6 or a concave upper surface as shown in FIG. 7. Alternatively, as shown in FIG. 8, a lens 6 formed of sapphire or quartz, etc., may be mounted after flatly filling the recessed portion 3a with the sealing resin 4. The shape of the lens 6 may be a hemispherical shape as shown in FIG. 8, or besides the hemisphere, may be a convex shape, a concave shape, or other shapes.

Figure 9:
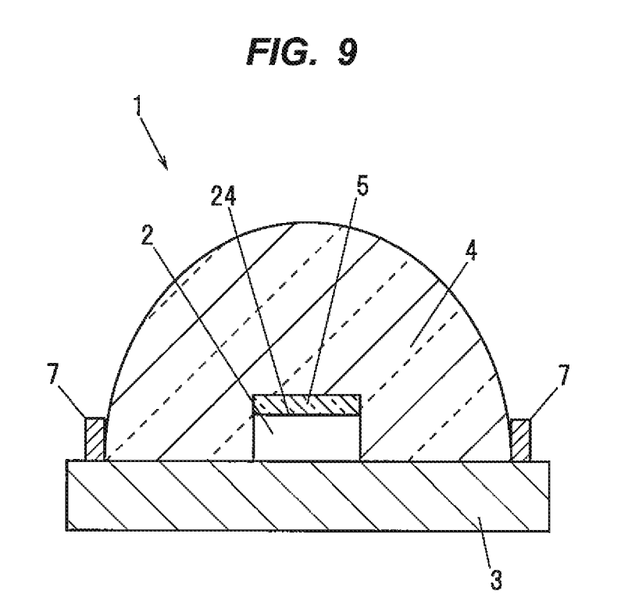
FIG. 9 is a cross sectional view showing the light-emitting device in a modification of the invention.

Furthermore, as shown in FIG. 9, the package substrate 3 may be formed in a plate shape. In this case, the sealing resin 4 is formed to cover the entire semiconductor light-emitting element 2, and may be molded using a casting mold, etc., into a desired shape such as hemisphere. Although a dam material 7 for preventing the sealing resin 4 from flowing out is formed on the package substrate 3 in the example shown in FIG. 9, the dam material 7 may be removed after molding the sealing resin 4.

Functions and Effects of the Embodiment

The level of light output is correlated with degradation rate of the sealing resin 4. Therefore, in case of conventional resin-sealed light-emitting devices, there is no choice but to operate at a significantly low light output such as, e.g., not more than several mW to ensure practical device lifetime such as, e.g., several thousand hours. When the conventional resin-sealed light-emitting devices are operated at a light output of about several tens mW which is a general rated light output, it is difficult to ensure practical lifetime due to degradation of the sealing resin 4. That is, the conventional resin-sealed light-emitting devices are not sufficient in terms of practical utility and reliability since, e.g., light output is significantly low or lifetime is not guaranteed.

Based on this, the semiconductor light-emitting device 1 in the present embodiment is configured that the coat film 5 is provided between the light output surface 24 of the semiconductor light-emitting element 2 and the sealing resin 4. Since the coat film 5 is provided, the sealing resin 4 is less likely to be affected by light totally reflected at the light output surface 24 of the semiconductor light-emitting element 2 and light intensity (light density) in the sealing resin 4 in the vicinity of the light output surface 24 of the semiconductor light-emitting element 2 (near the interface) is reduced. Thus, degradation of the sealing resin 4 due to ultraviolet light emitted from the semiconductor light-emitting element 2 can be significantly suppressed since degradation of the sealing resin 4 is correlated with light intensity as mentioned above. As a result, even at a practical light output of, e.g., about several tens mW, degradation of the sealing resin 4 is suppressed, thereby contributing to longer service life and improvement in reliability.

Furthermore, in the present embodiment, the refractive index of the coat film 5 and the refractive index of the sealing resin 4 are lower than the refractive index of the member constituting the light output surface 24 of the semiconductor light-emitting element 2, and in addition, the refractive index difference between the coat film 5 and the sealing resin 4 is not more than 0.15. When such a refractive index relation is satisfied, most of total reflection occurs at the interface between the member constituting the light output surface 24 of the semiconductor light-emitting element 2 and the coat film 5, and most of the light transmitted through such an interface also transmits through the interface between the coat film 5 and the sealing resin 4. This results in further reducing the impact of the totally reflected light on the sealing resin 4. Furthermore, since the refractive indices of the coat film 5 and the sealing resin 4 are refractive indices between those of the air and the member constituting the light output surface 24 of the semiconductor light-emitting element 2, total reflection itself is reduced at the interface between the member constituting the light output surface 24 of the semiconductor light-emitting element 2 and the coat film 5 and light extraction efficiency is thereby improved. As such, according to the present embodiment, it is possible to realize the resin-sealed semiconductor light-emitting device 1 which achieves both practical light output and lifetime.

Summary of the Embodiment

Technical ideas understood from the embodiment will be described below citing the reference numerals, etc., used for the embodiment. However, each reference numeral, etc., described below is not intended to limit the constituent elements in the claims to the members, etc., specifically described in the embodiment.

[1] A semiconductor light-emitting device (1), comprising: a semiconductor light-emitting element (2) that emits ultraviolet light; a package substrate (3) mounting the semiconductor light-emitting element (2); a sealing resin (4) that seals the semiconductor light-emitting element (2); and a coat film (5) further provided between a light output surface (24) of the semiconductor light-emitting element (2) and the sealing resin (4), wherein the refractive index of the coat film (5) and the refractive index of the sealing resin (4) are smaller than the refractive index of a member constituting the light output surface (24) of the semiconductor light-emitting element (2), and the refractive index difference between the coat film (5) and the sealing resin (4) is not more than 0.15.

[2] The semiconductor light-emitting device (1) described in [1], wherein the semiconductor light-emitting element (2) emits ultraviolet light at a wavelength of not more than 300 nm.

[3] The semiconductor light-emitting device (1) described in [1] or [2], wherein the coat film (5) has a thickness of not more than 25 µm.

[4] The semiconductor light-emitting device (1) described in any one of [1] to [3], wherein a surface of the coat film (5) on the sealing resin (4) side is formed in a curved shape.

[5] The semiconductor light-emitting device (1) described in any one of [1] to [4], wherein the transmittance of the ultraviolet light through the coat film (5) is not less than 90%, and the transmittance of the ultraviolet light through the sealing resin (4) is not less than 80%.

[6] The semiconductor light-emitting device (1) described in any one of [1] to [5], wherein the sealing resin (4) comprises a resin comprising a silicone resin as a main component, and the coat film (5) comprises a glass film comprising $SiO_2$ as a main component or comprises amorphous $SiO_2$.

Although the embodiment of the invention has been described, the invention according to claims is not to be limited to the embodiment described above. Further, please note that all combinations of the features described in the embodiment are not necessary to solve the problem of the invention. In addition, the invention can be appropriately modified and implemented without departing from the gist thereof.

REFERENCE SIGNS LIST

1: semiconductor light-emitting device
2: semiconductor light-emitting element
21: growth substrate
22: nitride semiconductor layer
24: light output surface
3: package substrate
3a: recessed portion
4: sealing resin

The invention claimed is:

1. A semiconductor light-emitting device, comprising:
a semiconductor light-emitting element having a light output surface that emits ultraviolet light, the light output surface being a top surface of the semiconductor light-emitting element;
a package substrate mounting the semiconductor light-emitting element;
a sealing resin that seals the semiconductor light-emitting element; and
a coat film provided only on the top surface of the semiconductor light-emitting element between the light output surface of the semiconductor light-emitting element and the sealing resin,
wherein the refractive index of the coat film and the refractive index of the sealing resin are smaller than the refractive index of a member constituting the light output surface of the semiconductor light-emitting element, and the refractive index difference between the coat film and the sealing resin is not more than 0.15,
wherein the sealing resin comprises a resin comprising a silicone resin as a main component,
wherein the semiconductor light-emitting element emits deep ultraviolet light at a wavelength of not more than 300 nm,
wherein the transmittance of the ultraviolet light through the coat film is not less than 90%, and the transmittance of the ultraviolet light through the sealing resin is not less than 80%,
wherein the thickness of the coat film is not less than 0.5 μm and not more than 5.0 μm,
wherein coat film comprises a glass film comprising $SiO_2$ as a main component or comprises amorphous $SiO_2$;
wherein the coat film does not contain fluorescent materials; and
wherein the light output surface is a surface of the semiconductor light-emitting element opposite to a side of the semiconductor light-emitting element mounted on the package substrate.

2. The semiconductor light-emitting device according to claim 1, wherein a surface of the coat film on the sealing resin side is formed in a curved shape.

* * * * *